(12) United States Patent
Ottaviani et al.

(10) Patent No.: US 10,732,307 B2
(45) Date of Patent: Aug. 4, 2020

(54) METHOD FOR CARRYING OUT A NEUTRON DETECTOR AND NEUTRON DETECTOR

(71) Applicants: COMMISSARIAT A L'ENERGIE ATOMIQUE ET AUX ENERGIES ALTERNATIVES, Paris (FR); UNIVERSITE D'AIX-MARSEILLE, Marseilles (FR)

(72) Inventors: Laurent Ottaviani, Marseilles (FR); Vanessa Vervisch, Marseilles (FR); Fatima Issa, Marseilles (FR); Abdallah Lyoussi, Manosque (FR)

(73) Assignees: COMMISSARIAT A L'ENERGIE ATOMIQUE ET AUX ENERGIES ALTERNATIVES, Paris (FR); UNIVERSITE D'AIX-MARSEILLE, Marseilles (FR)

( * ) Notice: Subject to any disclaimer, the term of this patent is extended or adjusted under 35 U.S.C. 154(b) by 284 days.

(21) Appl. No.: 15/537,158

(22) PCT Filed: Dec. 21, 2015

(86) PCT No.: PCT/EP2015/080855
§ 371 (c)(1),
(2) Date: Jun. 16, 2017

(87) PCT Pub. No.: WO2016/097415
PCT Pub. Date: Jun. 23, 2016

(65) Prior Publication Data
US 2017/0363755 A1    Dec. 21, 2017

(30) Foreign Application Priority Data
Dec. 19, 2014    (FR) .................................. 14 63019

(51) Int. Cl.
*G01T 3/08*      (2006.01)
*H01L 31/118*    (2006.01)
*G01T 7/00*      (2006.01)

(52) U.S. Cl.
CPC ............ *G01T 3/08* (2013.01); *H01L 31/1185* (2013.01); *G01T 7/00* (2013.01)

(58) Field of Classification Search
CPC ...................................................... G01T 3/08
See application file for complete search history.

(56) References Cited

U.S. PATENT DOCUMENTS 3,227,876 A    1/1966  Ross
5,726,453 A    3/1998  Lott et al.
(Continued)

FOREIGN PATENT DOCUMENTS

GB    2 166 280 A    4/1986
IT    1213233 B     12/1989
(Continued)

OTHER PUBLICATIONS

Vervisch, Vanessa, et al. "Nuclear radiation detector based on ion implanted pn junction in 4H—SiC." 2013 3rd International Conference on Advancements in Nuclear Instrumentation, Measurement Methods and their Applications (ANIMMA). IEEE, 2013. (Year: 2013).*

(Continued)

*Primary Examiner* — Daniel Luke
(74) *Attorney, Agent, or Firm* — Oblon, McClelland, Maier & Neustadt, L.L.P.

(57) ABSTRACT

A method for producing a device for detecting flux of neutrons with parameters in predetermined ranges, including: one phase of determining parameters, including: simulating penetration of a flux of incident neutrons with parameters in the predetermined ranges through a modelled stack (Continued)

including in succession and in order at least: one first electrode; one substrate including: a first layer; and a second layer; and one second electrode; and simulating at least one defect peak created in the first layer by vacancies and/or ionization of the particles generated by collisions between neutrons of the flux of incident neutrons and atoms of the second dopant species; and identifying depth of the defect peak closest the interface between the first and second layers of the modelled stack.

19 Claims, 3 Drawing Sheets

(56) References Cited

U.S. PATENT DOCUMENTS

| | | | |
|---|---|---|---|
| 5,969,359 | A | 10/1999 | Ruddy et al. |
| 7,943,402 | B2 | 5/2011 | Milesi et al. |
| 2011/0049379 | A1 | 3/2011 | Moses |
| 2011/0266643 | A1 | 11/2011 | Engelmann et al. |
| 2012/0235260 | A1 | 9/2012 | Nikolic et al. |
| 2013/0009262 | A1 | 1/2013 | Dowben et al. |
| 2013/0075848 | A1 | 3/2013 | Nikolic et al. |

FOREIGN PATENT DOCUMENTS

| | | |
|---|---|---|
| WO | WO 99/22251 A2 | 5/1999 |
| WO | WO 2004/040332 A2 | 5/2004 |
| WO | WO 2013/011751 A1 | 1/2013 |
| WO | WO 2014/024568 A1 | 2/2014 |
| WO | WO 2014/038281 A1 | 3/2014 |

OTHER PUBLICATIONS

International Search Report and Written Opinion dated Mar. 16, 2016 in PCT/EP2015/080855 (with English translation).
R. J. Nikolic et al., "Future of Semiconductor Based Thermal Neutron Detectors", Nanotech 2006, 2006, 7 pages.
A N Caruso, "The physics of solid-state neutron detector materials and geometries", Journal of Physics: Condensed Matter 22, 43201, 2010, pp. 1-32.
F Issa et al., "Radiation Silicon Carbide Detectors Based on Ion Implantation of Boron", IEEE Transactions on Nuclear Science, vol. 61, No. 4, XP011556467, Aug. 2014, pp. 2105-.2111
Robert Venn, "Semi-direct thermal neutron detection via the 10B-neutron reaction using a solid state heterodiode", Cambridge Microfab Ltd., Oct. 2008, 20 pages.
Alan Briggs et al., "Development of Thermal Neutron Detection via Boron-Rich Heterodiode Sensors" Cambridge Microfab Ltd., 2011, 23 pages.
Tsunenobu Kimoto et al., "Formation of Deep pn Junctions by High-Energy Al and B ion Implantations into SiC" IEEJ Transactions on Electronics Information and Systems 122(1):17-22, Jan. 2002 (submitting English abstract only).
S. D. Russell et al., "In situ boron incorporation and activation in silicon carbide using excimer laser recrystallization" Applied Physics Letters 74, 1999, (submitting English abstract only).
J. Pelletier et al., "Plasma-based ion implantation and deposition: a review of physics, technology, and applications", IEEE Transactions on Plasma Science, vol. 33, Issue 6, Dec. 2005 (submitting English abstract only).
V. Vervisch et al., "Nuclear radiation detector based on ion implanted p-n junction in 4H—SiC", $3^{rd}$ International Conference on Advancements in Nuclear Instrumentation, Measurement Methods and their Applications, XP032560659, 2013 (submitting English abstract only).
L. Ottaviani et al., "Study of Defects Generated by Standard- and Plasma-Implantation of Nitrogen Atoms in 4H—SiC Epitaxial Layers", Materials Science Forum, vol. 725, XP055222415, 2012 (submitting English abstract only).
L. Ottaviani et al., "Influence of Heating and Cooling Rates of Post-Implantation Annealing Process on Al-Implanted 4H—SiC Epitaxial Samples", Materials Science Forum, vol. 645-648, 2010, XP055222404, (submitting English abstract only).
"Thermal neutron detection enhancement by 10B implantation in silicon carbide sensor," Vanessa Vervisch et al.; MRS Online Proceeding Library Archive 1693, Jan. 2014, DOI 10.1557 (Vervisch).

* cited by examiner

— ⊙ — IONIZATION GENERATED BY $^4$He AND $^7$Li
— ■ — GAPS GENERATED BY $^4$He AND $^7$Li

METHOD FOR CARRYING OUT A NEUTRON DETECTOR AND NEUTRON DETECTOR

FIELD OF THE INVENTION

This invention relates to the field of detecting particles present in a particular environment. Atomic and/or subatomic (nuclear) particles are generally detected by the signature that they produce by interacting with their environment. This invention relates in particular to a method and a device for detecting neutrons. It has for an advantageous but not limiting application the detection of neutrons and/or of photons in a harsh environment.

TECHNOLOGICAL BACKGROUND

The operating principle of neutron detectors is based on the interaction of neutrons, for example thermal (energy of 0.025 eV i.e. in thermal equilibrium in a medium at 20° C.), with atoms and/or nuclei of a neutron-converting material. For example the interaction of neutrons with the Boron-10 isotope ($^{10}$B) produces alpha ($^{4}$He) and lithium ($^{7}$Li) particles (nucleus). According to a configuration example the particles are generated in opposite directions according to the following reactions (and their associated probabilities) with an energy Q:

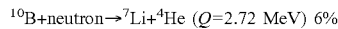

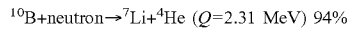

The detector as such requires the presence of a Neutron Conversion Layer (NCL) in order to convert in fine the incident neutrons into electron-hole pairs.

The ionization of the material, produced by the generation of $^{7}$Li and $^{4}$He particles/nuclei, can then be detected thanks to the electric field present at the terminals of a Space Charge Region (SCR). The space charge region (SCR), also called depletion zone, or deserted zone, corresponds to the region that appears in a p-n junction, between an n-doped region and a p-doped region. It is called "depletion zone" or "deserted zone" because it is devoid of free carriers, and it is called "space charge region" because it is comprised of two electrically charged regions (contrary to the rest of the semiconductor n and of the semiconductor p which are globally neutral). As such, a detector requires the presence of a p-n junction in order to generate said space charge region and as such collect the carriers coming from the aforementioned reactions.

The document "Nuclear Radiation Detector Based on Ion Implanted p-n Junction in 44-SiC", relates to a detector of thermal neutrons. This detector comprises a thick layer of the n+ type formed by SiC, a p+ doped layer by implantation of aluminum (Al+) ions in the n+ layer of SiC. The p+ doped layer defines with the n+ doped layer the space charge region (SCR) which extends in the n+ layer from the n/p interface. Moreover, the detector comprises a layer that is rich in the boron-10 isotope ($^{10}$B) forming the neutron conversion layer (NCL). Furthermore, this neutron detector requires polarization. This document discloses that an increase in the polarization makes it possible to improve the quality of the signal.

This detector is globally satisfactory. On the other hand, it has been shown that it delivers results that are unstable over time.

This invention aims to propose a solution to overcome this disadvantage.

SUMMARY OF THE INVENTION

To this effect, this invention proposes a method for the realization of a device for detecting a neutron flux having characteristics within predetermined ranges. The method advantageously comprises at least one phase of determining parameters comprising the following steps:

simulating or representing the penetration of a flux of incident neutrons having characteristics within said predetermined ranges through a modeled stack comprising successively and in order at least: a first electrode; a substrate comprising: a first doped layer comprising at least one first dopant species in such a way that the first layer is an n-doped layer or a p-doped layer, with the first layer being formed by the substrate; a second doped layer comprising at least one second dopant species in such a way that the second layer is the other among an n-doped layer or a p-doped layer in such a way as to form, at an interface between the first and second layers, a p-n junction and in such a way as to form in the first layer (and using the interface between the first and second layers), a space charge region; with the second layer being formed by implantation of the second dopant species in the substrate; the second dopant species being taken from neutron-converting materials, the second layer forming as such a neutron conversion layer; a second electrode;

simulating or identifying at least one peak of defects created in the first layer by the gaps and/or the ionization of the particles generated by the collisions between the atoms of the second dopant species and the neutrons of said flux of incident neutrons having characteristics within said predetermined ranges;

identifying the depth of the peak of defects closest to the interface between the first and second layers of the modeled stack;

determining parameters of the first and second layers that the modeled stack should have, in particular the depth of said implantation of the second dopant species in the substrate in order to form the second layer (and therefore the thickness of the second layer) and the content (or concentration) in first and second dopant species of the first and second layers, in such a way that the space charge region extends from said interface between the first and second layers and in the first layer over a depth less than said identified depth of said peak of defects in such a way that the space charge region does not comprise any peak of defects.

As such, the interface between the first layer and the second layer doped with the second dopant species defined in the first layer and using the interface between the first and second layers, a space charge region. Moreover, this same second dopant species is taken from neutron-converting materials, the second layer forming as such a neutron conversion layer. As such, the second layer forming the neutron conversion layer extends to the space charge region. The space charge region and the neutron conversion layer are therefore adjacent. This has for consequence that the maximum of the rate of ionization, at the outlet of NCL, is in the SCR. However the signal detected depends very closely on the rate of ionization detected. Consequently, this structure of the detector makes it possible to improve the signal substantially. Inversely, if there is an intermediate layer between NCL and SCR, the products of the reaction between the neutrons and the dopant species are partially absorbed by this intermediate layer.

Moreover, the method advantageously comprises a step of manufacturing the device for detecting wherein the first layer is carried out then the second layer is carried out by implantation of the second dopant species in a portion of the first layer, said implantation, in particular the implantation depth and the content in second dopant species being carried out according to said parameters determined in such a way that in the device manufactured the space charge region extends from said interface between the first and second layers and into the first layer over a depth that is less than identified depth of said peak of defects.

As such, the method according to the invention provides, during a first phase, to simulate the depth of the peaks of defects and to carry out the second layer of the substrate in such a way as to form the space charge region so that it does not contain any peak of defects. The peak of defects is advantageously provided by simulation. More preferably this is a digital simulation implemented by a computer. The peak of defects can also be simulated in a non-computer manner, by being identified, after the creation thereof, by analyses of the electron microscopy type carried out on at least one modeled stack manufactured beforehand and subjected to a flux of neutrons having characteristics within said predetermined ranges.

The synergy between the coming together of the SCR and of the NCL on the one hand and the configuration of the SCR which comprises the peak of defects on the other hand, makes it possible to detect at the terminals of the space charge region a substantial and precise signal, and this without requiring polarization. Indeed, with the detector according to the invention a sufficient signal is detected at 0 Volts at the terminals of the SCR. With a device from prior art, no signal would be detected by applying a zero voltage at the terminals of the SCR or the existing signal would have a signal-to-noise ratio that is much too weak. With the detectors of prior art, a polarization is therefore indispensable.

However, in the framework of the development of this invention it was shown that with the detector mentioned as is the quality of the signal provided is degraded over time. This limitation in terms of stability is particularly difficult to anticipate.

In the framework of the development of this invention it was noticed that this absence of stability comes from a degradation over time of the SCR. It was also identified that this degradation comes from the application of a polarization at the terminals of the SCR.

Indeed, it is highly likely that the polarization ionizes the gaps in the SCR and disturbs the material of the SCR which modifies it over time. As such the electric field of the SCR which is generated by the products of the reaction between neutrons and neutron converting material, varies over time. The direct consequence of this damage of the SCR is the presence of a degraded output signal and that is unstable over time. This is particularly detrimental for taking continuous or one-off measurements that extend over time and where the change in the signal must be monitored.

Moreover, the more the inverse polarization is increased, which is what prior art recommends to increase the signal-to-noise ratio, the more the SCR is damaged and therefore the stability of the results is reduced by as much and therefore the lifespan of the detector.

As it does not need any polarization, the detector realized as such is simpler and less expensive than those of prior art that require polarization.

Moreover, the absence of polarization makes the detector according to the invention more robust and reliable in harsh conditions of use in particular due to the absence of connections, cables and components required for polarization.

Advantageously, the second layer of the substrate is formed in such a way that the space charge region contains the maximum of the rate of ionization. The rate of ionization is advantageously determined by simulation. More preferably this is a digital simulation implemented by a computer. The rate of ionization can also be simulated in a non-computer manner, by being identified, after the creation thereof, by physical-chemical analyses of the Secondary Ion Mass Spectrometry (acronym "SIMS") type, by assimilating the profile of the ions with the ionization profile of the material. It is moreover possible to evaluate the rate of ionization of the material by measuring the response of the detector according to the polarization voltage.

On the other hand, the precision of the signal detected by the detector allows for a discrimination between neutrons and gamma.

The invention as such makes it possible to substantially increase the reliability and the lifespan of the detectors, in particular in a harsh environment.

According to a particular embodiment, the substrate is made of silicon carbide (SiC). This makes it possible to very significantly increase the robustness, reliability and lifespan of the detector in harsh conditions of use.

This invention also relates to a method for determining parameters in order to produce a device for detecting a neutron flux of which the flux parameters are within predetermined ranges. The method comprises:
  a step of simulating the penetration of a flux of incident neutrons of which the parameters are within said predetermined ranges through a modeled stack comprising successively and in order at least: a first electrode; a substrate comprising: a first n-doped or respectively p-doped layer comprising at least one first species, with the first layer being formed by the substrate; a second p-doped or respectively n-doped layer, comprising at least one second dopant species in such a way as to form, at an interface between the first and second layers, a p-n junction and in such a way as to form in the first layer (and using the interface between the first and second layers), a space charge region; with the second layer being formed by implantation of the second dopant species in the substrate; with the second dopant species being taken from neutron-converting materials in such a way as to form a neutron conversion layer; a second electrode;
  a step of simulating at least one peak of defects created in the first layer by the gaps and/or the ionization of particles generated by the collisions between the neutrons of the flux of incident neutrons and the atoms of the second dopant species; identifying the depth of the peak of defects closest to the interface between the first and second layers of the modeled stack;
  a step of determining the parameters of the first and second layers that the modeled stack should have, in particular the depth of said implantation of the second dopant species in the substrate in order to form the second layer (and therefore the thickness of the second layer) and the content in first and second dopant species of the first and second layers, in such a way that the space charge region extends from said interface between the first and second layers and in the first layer over a depth less than said identified depth of said peak of defects in such a way that the space charge region does not comprise any peak of defects.

According to another embodiment, the invention relates to a detector of a flux of neutrons that have characteristics within predetermined ranges, with the detector comprising at least one stack of layers comprising successively and in order: a first electrode; a substrate comprising: a first n-doped or respectively p-doped layer comprising at least one first n dopant or respectively p dopant species, with the first layer being formed by the substrate; a second p-doped or respectively n-doped layer comprising at least one second dopant species in such a way as to form, at an interface between the first and second layers, a p-n junction and in such a way as to form in the first layer and using the interface between the first and second layers, a space charge region; a second electrode. Advantageously, the second layer is formed by implantation of the second dopant species in the substrate; with the second dopant species being taken from neutron-converting materials in order to form a neutron conversion layer. Advantageously, the parameters of the first and second layers, in particular the implantation depth of the second dopant species in the substrate in order to form the second layer (and therefore the thickness of the second layer) and the contents in the first and second dopant species respectively of the first and second layers, are chosen so that the space charge region extends from said interface between the first and second layers and in the first layer over a depth less than a depth where would be located a peak of defects that would be created in the first layer by gaps and/or an ionization of particles generated by the collisions between atoms of the second dopant species and neutrons if the detector were exposed to a flux of neutrons of which the parameters are within said predetermined ranges.

The invention relates on the other hand to a use of the detector wherein the detector is exposed to a flux of neutrons of which the parameters are within said predetermined ranges.

BRIEF INTRODUCTION OF THE FIGURES

Other characteristics, purposes and advantages of this invention shall appear when reading the following detailed description, with regards to the annexed drawings, given as non-limiting examples, and wherein.

The drawings are given as examples and do not limit the invention. They constitute block representations intended to facilitate the comprehension of the invention and are not necessarily to the scale of the practical applications. In particular, the relative thickness of the various layers and films are not representative of reality.

DETAILED DESCRIPTION

It is stated that in the framework of this invention, the term "on" does not necessarily mean "in contact with". As such, for example, the deposition of a layer on another layer, does not necessarily means that the two layers are directly in contact with one another but this means that one of the layers covers at least partially the other by being either directly in contact with it, or by being separated from it by a film, or another layer or another element.

Figure 1:
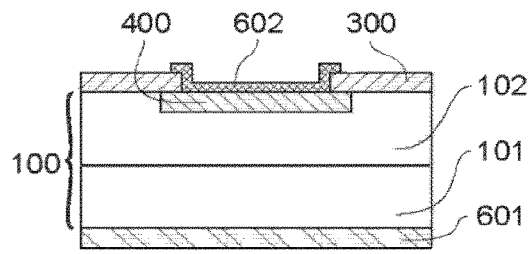
FIG. 1 shows a cross-section view of the neutron detector according to this invention.

It is stated that in the framework of this invention, the thickness of a layer is measured according to a direction perpendicular to the surface according to which this layer has its maximum extension. Typically, when the layers form portions of cylinder, their thickness is taken according to a direction perpendicular to the two surfaces forming disks. In FIG. 1, the thickness is taken along the vertical.

The same applies for measuring a depth, for example of a space charge region or of an implantation.

In the framework of this invention the depth of the space charge region or of the defect peaks is measured from the interface between the first and second layers.

The invention applies to the detection of thermal, slow, epithermal and fast neutrons. Slow neutrons are neutrons that have an energy varying from 0.025 eV to 10 eV. Epithermal neutrons are neutrons that have an energy between 10 eV and 500 keV. Fast neutrons are neutrons that have an energy greater than 0.5 MeV. In sum, the invention applies to the detection of neutrons of which the energy varies from 0.025 eV to a few mega-electron-volts or even a few tens of mega-electron-volts.

Before beginning a detailed review of embodiments of the invention, optional characteristics are mentioned hereinafter that can possibly be used in association or alternatively with the method according to the invention or with the detector:

The substrate comprises silicon carbide (SiC). This contributes to the reliability of the detector in a harsh environment.

The second layer is carried out by implantation of the second dopant species in a portion of the first layer according to said determined parameters.

The step of determining the parameters of the detector is at least partially assisted or implemented by computer. This is typically a digital simulation implemented by a computer comprising at least one microprocessor. In particular, the step of simulating the penetration of a flux of incident neutrons is implemented by computer.

Alternatively, the step of determining the parameters of the detector can also be simulated in a non-computer manner, by analyses of the electron microscopy type on detectors manufactured beforehand. In particular, the step of identification of the peak of defects comprises electron microscopy analyses carried out on at least one modeled stack manufactured beforehand and subjected to a flux of neutrons that has characteristics within said predetermined ranges.

The step of identifying the stack of layers comprises for example the simulating or the modeling of the stack. Alternatively, it can comprise the material realization of a stack.

said predetermined characteristics of the flux of neutrons comprise at least one from among: a given energy and/or a flux and/or a fluence and/or an intensity During the step of manufacturing the position of the space charge region is determined, in particular the depth of the p/n interface (depth of the interface between the first and second layers) according to the following parameters: the thickness of the second layer (in μm) and/or the energy of the implantation of the second dopant species (in eV).

During the step of manufacturing the depth of the space charge region is adjusted according to the following parameters: the content in dopant species of the first layer (in at/cm$^3$), the dose of the implantation of the second dopant species (in at/cm$^2$), the depth of the implantation of the second dopant species.

According to a privileged embodiment, during the step of manufacturing the position of the space charge region is determined, in particular the depth of the p/n interface (depth of the interface between the first and second layers) according to the energy of the implantation of the second dopant species (in eV). During the step of manufacturing the thickness of the space charge region is adjusted according to the concentration in first dopant of the first layer (in at/cm$^3$) and of the dose of the implantation of the second dopant species (in at/cm$^2$).

The first layer of the substrate is free of the second dopant species.

The second dopant species comprises the boron-10 isotope ($^{10}$B). According to an embodiment, the second dopant species is only boron, with this boron comprising the boron-10 isotope ($^{10}$B). Preferably the second dopant species is solely the boron-10 isotope ($^{10}$B).

The first layer of the substrate comprises at least one n+ doped lower layer and one n-doped upper layer; with said upper layer comprising a concentration in first dopant species between 10$^{14}$ and 10$^{16}$ at/cm$^3$.

The depth of the space charge region depends on the doping parameters and on the thickness of the upper layer of the first layer of the substrate.

The first electrode is in contact with the first layer, the first layer is in contact with the second layer and the second electrode is in contact with the second layer. Preferably, the first electrode is in contact with the first layer. Preferably, the first layer is in contact with the second layer. Preferably, the second electrode is in contact with the second layer.

The peak of defects is a region wherein the concentration in defects is greater than or equal to 0.005 gaps/(Å-ion). The defects are generated by a collision between neutrons and said second dopant species.

The space charge region extends over a distance between 0 and a few tens of microns.

The detector comprises a single second dopant species. As such with a single species, typically $^{10}$B, the NCL is formed and, with the substrate, the p/n junction is defined.

The space charge region is adjacent to the neutron conversion layer, i.e. in direct contact with it or in the immediate vicinity of it. There is no intermediate layer between SCR and NCL. The space charge region is adjacent or in direct contact with at least a portion of the SCR.

The NCL extends from the electrode in contact with the SCR. This characteristic as such allows for a substantial increase on the quality of the signal.

The NCL is separate from the two electrodes. The NCL is located between the two electrodes. According to a non-limiting embodiment, the NCL is at least partially in contact with one of the electrodes.

The detector does not include the polarization of the SCR. It is free of a polarizing device.

The depth of the space charge region is adjusted, in particular by adjusting the contents in first and second dopant species of the first and second layers and in particular by adjusting the implantation of the second dopant species in such a way that the space charge region extends in the first layer, starting from said interface, over a sufficient depth to include the region where the rate of ionization of the particles generated by said collisions between the atoms of the second dopant species and the neutrons of said flux of incident neutrons that have characteristics within said predetermined ranges is the highest. As such, with respect to the entire depth of the substrate, the rate of ionization has its maximum in this region.

The first electrode and the second electrode include a metallic material.

According to an embodiment, the implantation of the second dopant species is carried out by means of the Boron-10 isotope, with an energy between 20 and 180 keV and a dose between 10$^{15}$ and 10$^{17}$ cm$^{-2}$.

According to another embodiment, the implantation of the second dopant species is carried out by plasma implantation of the Boron-10 isotope, with a voltage between 5 and 15 kV and a dose between 10$^{15}$ and 10$^{17}$ cm$^{-2}$.

According to another embodiment, the concentration of the second dopant species, for example of boron-10 isotope, in the substrate is greater than 1×10$^{19}$ at/cm$^3$. Preferably, it is between 1×10$^{19}$ at/cm$^3$ and 1×10$^{21}$ at/cm$^3$.

Advantageously, after implantation of the second dopant species, an activation annealing of the second implanted species is then carried out. This annealing makes it possible to electrically activate the atoms of the second dopant species. For example if the atoms of the second dopant species are Boron atoms, this annealing allows for the creation of the p+ layer. Moreover, this annealing makes it possible to suppress at least a portion of the defects created by the implantation of boron.

According to a non-limiting embodiment, the annealing is carried out under argon. According to a non-limiting embodiment, the annealing is carried out at temperatures between 900 and 1700° C., for a duration between 30 and 120 minutes.

The realization of the n-doped upper layer preferably comprises a chemical vapor deposition.

The realization of the first electrode and the realization of the second electrode comprise a metallization.

Use of the detector for any one of the following applications: characterization of radioactive waste packages, the follow-up and the control of dismantling operations of nuclear installations, the nuclear control in nuclear fuel reprocessing plants, the controlling of experimental and power nuclear reactors, the control of the environment.

Use of the detector for mining or oil geo-prospection.

Use of the detector for medical physics.

Use of the detector for the field of internal security.

FIG. 1 shows the device for detecting neutrons according to this invention. In order to simulate the penetration of a flux of incident neutrons of which the parameters are within predetermined ranges through the device, it is necessary beforehand to determine a modeled stack of layers that corresponds to the device for detecting. The modeled stack comprises in particular a substrate. According to a particularly advantageous embodiment, the substrate comprises a first doped layer 100 comprising at least one first dopant species in such a way that the first layer 100 is an n-doped layer or a p-doped layer. The first layer 100 preferably comprises a stack of layers of which one lower layer 101 and one upper layer 102. Advantageously, the lower layer 101 preferably comprises silicon carbide (SiC). The lower layer 101 is advantageously highly doped (doping level of about a few 10$^{18}$ cm$^3$). The upper layer 102 of the substrate 100 preferentially comprises silicon carbide, for example of the n type, with a low doping level (concentration between $1\times10^{14}$ and $1\times10^{16}$ at/cm$^3$).

In an alternative embodiment of the invention, the lower layer 101 is less doped than the upper layer 102. As such, in this alternative realization, the layer 102 is highly doped, while the layer 101 is lightly doped.

The substrate advantageously comprises a second doped layer 400 comprising at least one second dopant species in such a way that the second layer 400 is the other from among an n-doped layer or a p-doped layer.

The substrate comprises a second doped layer 400 of the p type, according to a particular embodiment. The second layer 400 is more preferably carried out by implantation of ions of the p type in the upper layer 102 of the first layer 100.

Advantageously, the dopant species of the second layer 400 is a neutron-converting material. As such the second layer 400 advantageously forms a neutron conversion layer such as will be described in detail in what follows.

Advantageously, an additional layer 300 acts as a mask during the implantation.

Following the implantation of the initially doped first layer 100 of the n type by a dopant material of the p type forming the second layer 400, the semiconductor of the n type of the first layer 100 is put into contact with a semiconductor of the p type (p-n junction) of the second layer 400, the majority electrons of the n side (respectively the majority holes of the p side) will be driven to the p region (respectively to the n region for the holes) where they are the minority, through the phenomenon of diffusion. Doing this, they leave behind them ions of opposite charges, which ensure the electrical neutrality of the n and p semiconductors before they are put into contact. Finally, the electrons (respectively the holes) which have been displaced to the p region recombine with the majority holes (respectively with the majority electrons in the n region). There is therefore an appearance in the semiconductor of the n type i.e. in the upper layer 102 of the first layer 100, of a region devoid of electrons called space charge region 500 at the junction (respectively a region devoid of holes in the p-type semiconductor), although this region 500 still contains the ions resulting from the dopant atoms.

The second layer 400 forming the neutron conversion layer, the latter is in the immediate vicinity, and more precisely adjacent to the space charge region 500, which provides many advantages such as shall be described in detail in what follows.

The device for detecting also comprises a first electrode 601 and a second electrode 602, representing respectively the anode and the cathode.

Preferentially, the first layer 100 of the substrate is directly in contact with the first electrode 601 and the second layer 400 is directly in contact with the second electrode 602.

The stack comprising the first layer 100, the second layer 400, the first electrode 601 and the second electrode 602 forms the modeled stack, stack starting from which is simulated the penetration of the flux of incident neutrons. It is this modeled stack which makes it possible to determine the parameters that will be used to manufacture the real stack of the device for detecting.

Figure 2:
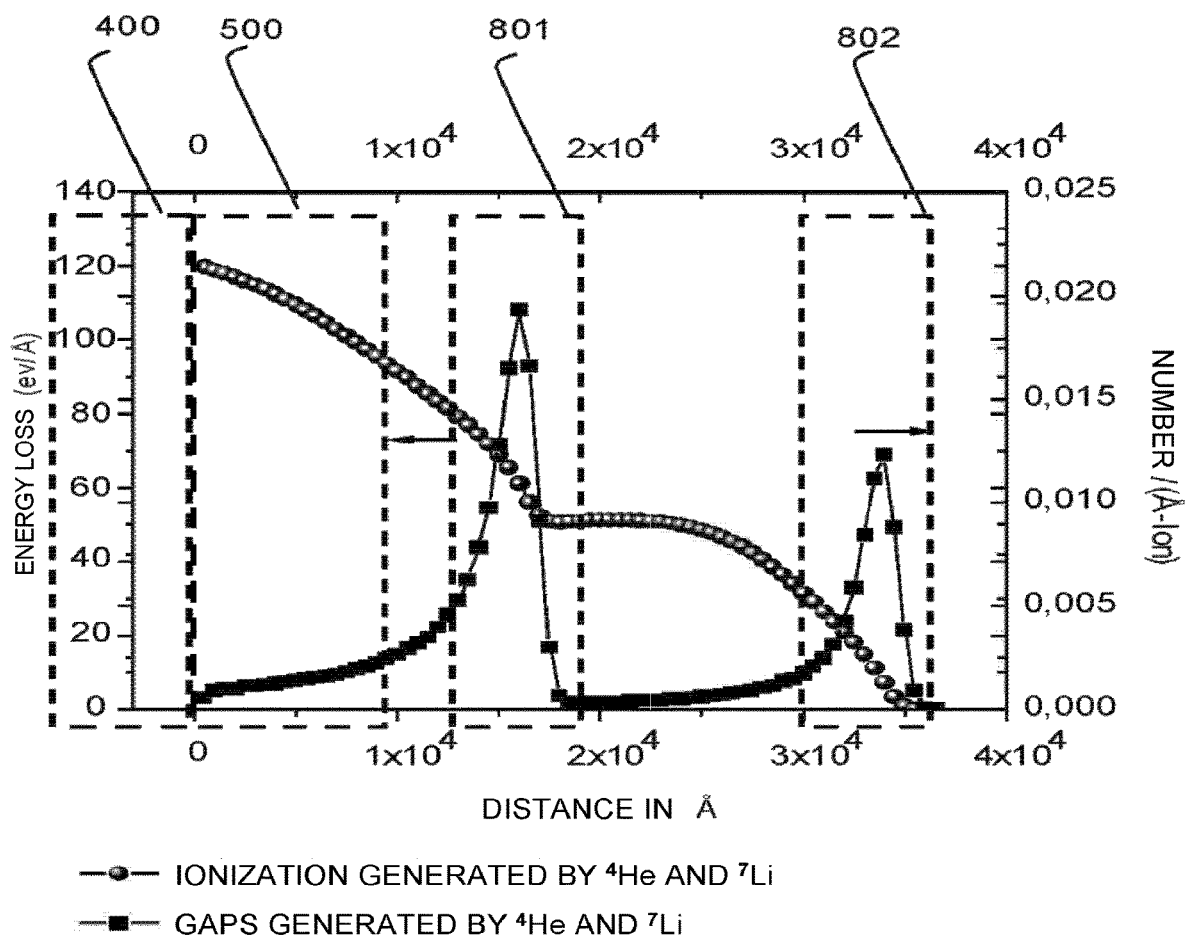
FIG. 2 shows ionization profiles linked to the particles/nuclei of lithium $^7Li$ and of helium $^4He$ as well as the profiles of defects or gaps coming from the interaction of these particles.

FIG. 2 shows ionization profiles linked to the particles of Lithium ($^7$Li) and of Helium ($^4$He) generated by the reactions between the incident neutrons and the atoms of the dopant material (i.e. the second dopant species), for example Boron ($^{10}$B). These profiles are obtained by simulation using the modeled stack. Using the simulation, during a parameter determining phase, the parameters of the various layers forming the modeled stack are modified in such a way as to determine the parameters of a real stack. The term "ionization" means the fact that a particle, for example an alpha particle of Helium ($^4$He), provided with high energy, can expel an electron from an atom encountered on its path, i.e. belonging to the medium passed through, i.e. the first layer 100. The atom that lost an electron becomes an ion. The particle ionizes a plurality of atoms present in the first layer 100 before stopping. The loss in energy due to the ionization is proportional to the mass and to the square of the charge of the particle. It varies with its speed. When the particle is slow, it passes more time close to an atom and it has a greater chance of provoking a collision. On the other hand, the specific ionization following a linear transfer of energy of the ionizing particle increases according to the travel of the particle. It is maximal at the end of its travel. In other words the ionizing particle deposits a small portion of its energy at the beginning of its travel. The largest portion is deposited at the end of the travel, i.e. when the particle is preparing to stop (Bragg peak).

Due to pulling off electrons, the particle loses its energy, slows down and in the end stops. The more intense the ionization is, the shorter the path is. Such is the case with alpha particles, of which the length of the travel depends on the initial energy. The electrons and the ions created recombine together after the passage of the ionizing particle.

These reactions advantageously take place near the lower limit of the neutron conversion layer 400.

FIG. 2 also shows the defect (gap) profiles coming from said particles at the end of travel. In order to obtain these profiles, a step of simulating is carried out in such a way as to simulate the penetration through the second layer 400 of a flux of incident neutrons of which the parameters are within predetermined ranges. The simulation makes it possible to obtain at least one peak 801, 802 of defects created in the first layer 100 by the gaps and/or the ionization of particles generated by the collisions between the incident neutrons and the atoms of the second dopant species.

The depth of the peak of defects 801 closest to the interface between the first and second layers 100, 400 is then identified. According to a non-limiting embodiment of the invention, a first peak 801 corresponding to the end of travel of the particles of lithium is determined at a depth between 1.5 and $2\times10^4$ Angstrom (1 Å=$10^{-10}$ m) starting from the interface between the second layer 400 and the space charge region 500. A second peak 802 corresponding to the end of travel of the particles of Helium is determined at a depth between 3.4 and $3.6\times10^4$ Å starting from the interface between the second layer 400 and the space charge region 500.

Advantageously, the space charge region 500 is located at the location where the ionization is maximal (without external polarization), i.e. in a region located in the vicinity of the interface that separates the first layer 100 from the second layer 400; said second layer 400 representing a doped portion of the first layer 100.

On the other hand, the space charge region 500 is particularly advantageously located outside of the first and second peaks of defects (gaps) 801, 802; said gaps being due to the collisions between the atoms of Lithium ($^7$Li) (and of Helium ($^4$He)) and the atoms forming the first layer 100 made of silicon carbide.

The position and the depth of the space charge region 500, where the rate of ionization is maximal and where there are no peaks of defects make it possible to obtain a substantial and reliable signal without external polarization. Moreover, this makes it possible to discriminate the neutrons from the gamma photons, with the thickness of the SCR being sufficiently low so that the detection of the gamma photons is separate from that of the neutrons. The gamma photons will have a low probability of interaction in the SCR given its low thickness.

In order to evaluate the path of the ($^7$Li) and Helium ($^4$He) particles generated following the collisions and as such simulate the positioning of the peak of defects 801, 802 that result according to the depth in the first layer 100, prior simulations are required. In this embodiment, the devices were tested in an experimental nuclear reactor at a temperature in the neighborhood of 50° C.

The simulations of the path of the particles and of the peaks of defects are for example carried out by SRIM (Stopping and Range of Ions in Matter), in the document F. Issa et al, "Radiation Silicon Carbide Detectors based on Ion Implantation of Boron", IEEE Transactions on Nuclear Science, vol. 61, no. 4, August 2014.

FIGS. 3A to 3H shows the steps of an example method for the purpose of realizing and manufacturing the device for detecting neutrons according to the invention using a modeled stack of layers.

Figure 3A:
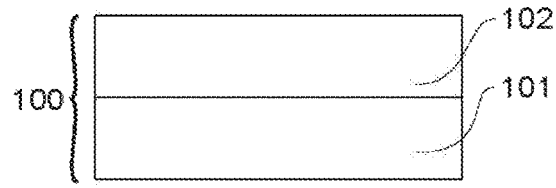
FIGS. 3A to 3H show diagrammatical views representing the various steps in the realization of the detector according to this invention.

FIG. 3A shows a diagrammatical view of the substrate 100. According to a particularly advantageous embodiment, the substrate 100 comprises a stack of layers of which a lower layer 101 and an upper layer 102. The lower layer 101 forms a substrate preferably of silicon carbide (SiC). The lower layer 101 is advantageously highly doped (doping level of about a few $10^{18}$ cm$^3$). The lower layer 101 advantageously of the n+ type, is realized by nitrogen doping. The thickness of this lower layer 101 is approximately for example 350 micrometers.

The upper layer 102 preferentially comprises silicon carbide of the n type, at a low doping level (concentration between $1\times10^{14}$ and $1\times10^{16}$ at/cm$^3$). The upper layer 102 is advantageously formed by epitaxy on the lower layer 101. According to an advantageous embodiment, the upper layer 102 is carried out via growth, preferably of the chemical vapor deposition type (CVD) or by liquid phase epitaxy (LPE) on the lower layer 101. The upper layer 102 is preferably doped with nitrogen. The thickness of the upper layer 102 is for example between 5 and 20 micrometers.

Figure 3B:
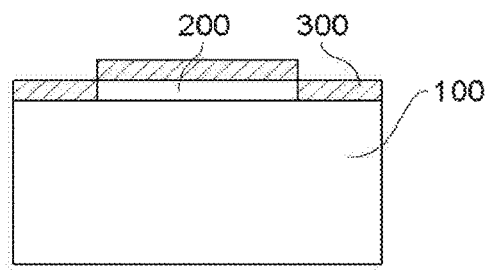

FIG. 3B shows the formation of patterns on the substrate 100 (and more precisely on the upper layer 102 of the substrate 100) using a masking layer 200. The realization of one or several patterns in a thin layer is commonly carried out using a method of photolithography during which a masking layer 200 is formed that has a pattern that is sought to be transferred in the thin layer. The transfer is then carried out by etching of the thin layer through the masking layer 200. According to a preferred embodiment an additional layer 300 is deposited onto the substrate 100 in such a way as to cover both the upper layer 102 of the substrate 100 and the masking layer 200. Advantageously, the masking layer 200 comprises a photosensitive resin that has negative flanks after development. This particular geometry makes it possible to obtain a discontinuity of the additional deposited layer 300. The additional layer 300 as such has bottom portions that correspond to the portions where the additional layer 300 is directly deposited in contact with the second layer 102 and top portions corresponding to the portions where the additional layer 300 is deposited onto the masking layer 200. The additional layer 300 is formed more preferably with an oxide base. The layer 300 can include for example silicon oxide (SiO$_2$) or silicon oxynitride (SiON).

Figure 3C:
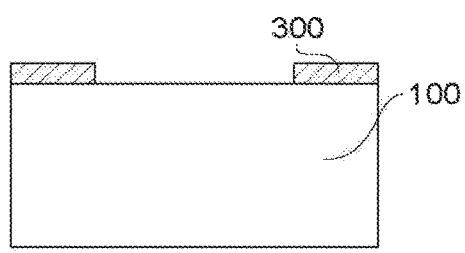

FIG. 3C shows the step of partial removal of the additional layer 300, forming patterns on the upper layer 101 of the substrate 100. The step of partial removal preferably comprises a wet etching. Advantageously, this etching is carried out by a technique called "Lift-off" which consists in carrying out the removal of the masking layer 200 by dissolution of the resin, in such a way as to retain the additional layer 300 only on the bottom portions, portions that do not rest on the masking layer 200.

Figure 3D:
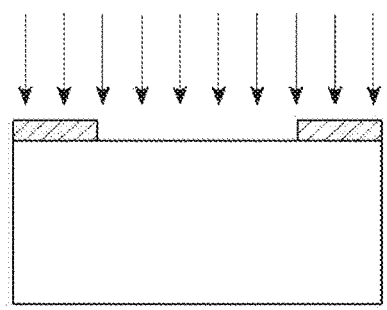

FIG. 3D shows the step of ion implantation of the second dopant species in the substrate 100. The parameters of the implantation, in particular the energy and the dose, will determine the implantation depth of the second dopant species in the substrate. The implantation technique also plays a role. Advantageously, the bottom portions remaining after the partial removal of the additional layer 300 are used as protection during the implantation. The additional layer 300 as such acts as a mask during the implantation. The step of implantation comprises a bombardment of the upper layer 102 of the substrate 100 with ions, in order to implant these ions in a sufficient dose in order to form in the upper layer 102 of the substrate 100 a second layer 400. This second layer 400 of the substrate 100 is advantageously doped using a second dopant species chosen from neutron-converting materials, in such a way that the neutron conversion layer is formed by the second layer 400. The implanted species is chosen in such a way as to allow for a conversion of the neutrons. The second layer 400 as such forms a neutron conversion layer, contained in the substrate 100. Advantageously, this neutron conversion layer or second layer 400 comprises, following the implantation, a strong dose of dopant material. Advantageously the concentration of second dopant species in the substrate 100 is greater than $1\times10^{19}$ at/cm$^3$. Typically, it is between $1\times10^{19}$ at/cm$^3$ and $1\times10^{21}$ at/cm$^3$. The dopant material is conformed is such a way as to create electron/hole pairs. The dopant material is advantageously chosen to react strongly with the neutrons.

The ions used for this implantation are preferably chosen from Boron, of the boron-10 isotope ($^{10}$B) type in order to form a p-type layer. According to other embodiments, the second dopant species could be chosen from Aluminum, Beryllium.

According to an embodiment, the implantation is carried out with an energy between 20 and 180 keV for a dose of Boron between $10^{15}$ and $10^{17}$ cm$^{-2}$. According to this embodiment, the implantation is carried out using a conventional implanter.

According to another embodiment referred to as "plasma", the implantation is carried out with a voltage between 5 and 15 kV for a dose of boron between $10^{15}$ and $10^{17}$ cm$^{-2}$. According to this embodiment, the implantation is carried out in a plasma reactor. The implantation is carried out, in the upper layer 102 of the first layer 100, only on the patterns; patterns which form openings. Advantageously, the method of implantation via plasma minimizes the rate of defects generated.

Prior to the step of implantation, a step of simulation is carried out in such a way as to identify the positioning and the depth of the space charge region 500 and the first and second peaks of defects 801, 802. The peaks of defects correspond to the regions where the concentration of gaps exceeds 0.005 gaps/(Å-ion). The space charge region 500 must then be positioned at the interface between the second layer 400 (i.e. the electron conversion layer) and the first peak of defects 801.

The parameters for determining the extent of the space charge region 500 comprise the parameters for the doping and for the thickness of the upper layer 102 of the first layer 100 of the substrate as well as the parameters for doping of the dopant material of the second dopant species forming the second layer or neutron conversion layer 400. The parameters for determining the positioning of the peaks of defects 801, 802 in the first layer 100 of the substrate are the parameters for the doping of the second dopant species.

The following table gives examples of doping parameters of the second dopant species of the second layer 400 used during the step of simulation. It is understood that these doses can advantageously vary according to the applications of the detector.

| Implanted element | Energy of the ions (keV) | Doping ($10^{14}$ cm$^{-2}$) |
|---|---|---|
| $^{10}$B | 20 | 3.5 |
|  | 50 | 5 |
|  | 90 | 6.3 |
|  | 140 | 7.4 |
|  | 180 | 8.5 |

Figure 3E:
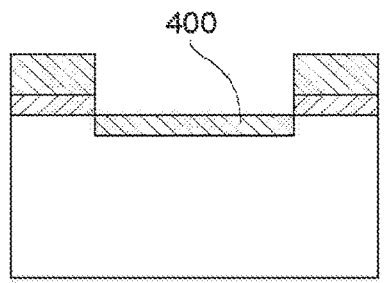

FIG. 3E shows the step of formation of the second layer 400 of the substrate by implantation of the second dopant species in the upper layer 102 of the first layer 100 of the substrate. Following the step of implantation, a space charge region 500 is formed extending through the first layer 100 of the substrate from the interface between the first layer 100 and the second layer 400 to a controlled depth less than the given depth, in such a way as to not include in said space charge region 500 said peaks of defects 801, 802.

The energy of the implanted ions defines the position of the SCR 500, typically the depth at which the p/n interface that delimits the upper limit of the SCR 500 is located. The implanted dose defines, at least partially, the thickness of the SCR 500, i.e. the depth over which the SCR 500 extends from the p/n interface. The doping of the substrate 100 also influences the thickness of the SCR 500.

As such, the p/n interface of the space charge region 500 and the neutron conversion region are defined by the same species: the second dopant species. Consequently, the space charge region 500 is adjacent to the neutron conversion layer. There is no intermediate layer between SCR 500 and NCL. This appears clearly in FIGS. 2 and 3F for example. As indicated hereinabove, the maximum of the ionization rate at the outlet of the NCL is therefore located in the SCR since the latter is directly in contact with the NCL. This makes it possible to improve the signal-to-noise ratio substantially.

The implantation of the second dopant species is carried out in such a way that the NCL extends from the electrode in contact with the SCR 500, in the example shown the electrode 602 which will be formed subsequently. As such, the NCL is not buried in the SCR or in another layer, by being positioned at a distance from the electrode. As such the initial substrate 100 is enriched with a second dopant species continuously from its upper surface and to the interface forming the p/n junction. This continuity of the presence of the second dopant species does not however imply that the concentration of the second dopant species is constant over this thickness.

Figure 3F:
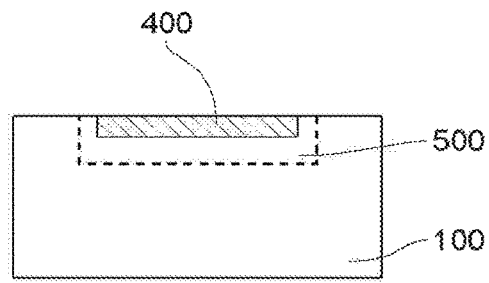

FIG. 3F shows the step of activation annealing. Advantageously, the activation annealing is carried out preferably under Argon, at a temperature preferably between 900 and 1700° C., for a duration preferably between 30 and 120 minutes. The post-implantation annealing is carried out after the removal of the additional layer 300. Advantageously, this annealing makes it possible to electrically activate the Boron atoms implanted for the creating of the p+ layer. Moreover, this annealing makes it possible to suppress at least a portion of the defects created by the implantation of boron. The high heating rate (preferably about 20° C./s), combined with a resistive heating mode that imposes good lateral homogeneity in temperature, makes it possible to retain a low surface roughness of the silicon carbide, and as such limit the loss of Boron via exo-diffusion. The term exo-diffusion here means the evaporation—i.e. the loss—of the dopant via the surface which generally occurs during the activation annealing.

According to an embodiment, the annealing is carried out in two successive steps that correspond to various temperature levels. The annealing is first carried out under a temperature in the neighborhood of 900° C. for 120 minutes with a heating rate of 20° C. per second, then the annealing reaches 1650° C. for 30 minutes followed by a cooling rate of 20° C. per minute.

Figure 3G:
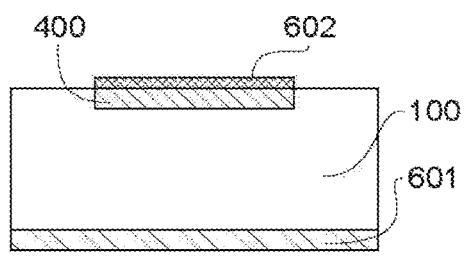

FIG. 3G shows the step of metallization of a first surface and of a second surface of the substrate 100. The step of metallization is carried out in such a way as to form a first metal layer 602 on the first surface of the substrate 100. Preferentially, the first surface of the substrate 100 is the surface starting from which the second layer 400 was formed. The flux of neutrons penetrates into the substrate first via this surface. Advantageously, the first metal layer 602 forms an electrode, commonly referred to as a cathode (or anode). The first metal layer 602 is carried out in such a way as to at least cover the neutron conversion layer 400 (or second layer 400). Preferentially, the first metal layer 602 comprises a stack of layers. According to an embodiment, the first metal layer 602 comprises a stack of materials of the Nickel/Titanium/Aluminum type. The thickness of the first metal layer 602 is preferably between 100 and 500 nanometers.

The step of metallization is carried out in such a way as to form a second metal layer 601 on the second surface of the substrate 100; with said second surface being opposite the first surface. Advantageously, the second metal layer 601 forms an electrode, commonly referred to as an anode (or cathode). The second metal layer 601 is carried out in such a way as to cover at least partially the second surface of the substrate 100, with said second face being opposite the first surface of the substrate 100. Preferentially, the second metal layer 601 comprises a stack of layers. According to an embodiment, the second metal layer 601 comprises a stack of materials of the Titanium/Nickel type. The thickness of the second metal layer 601 is preferably between 100 and 500 nanometers.

Figure 3H:
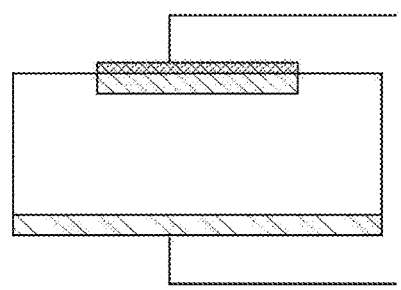

FIG. 3H shows the making of contact with the terminals of the first and second electrodes 601, 602, i.e. with the terminals respectively of the anode and of the cathode 601, 602.

Figure 4:
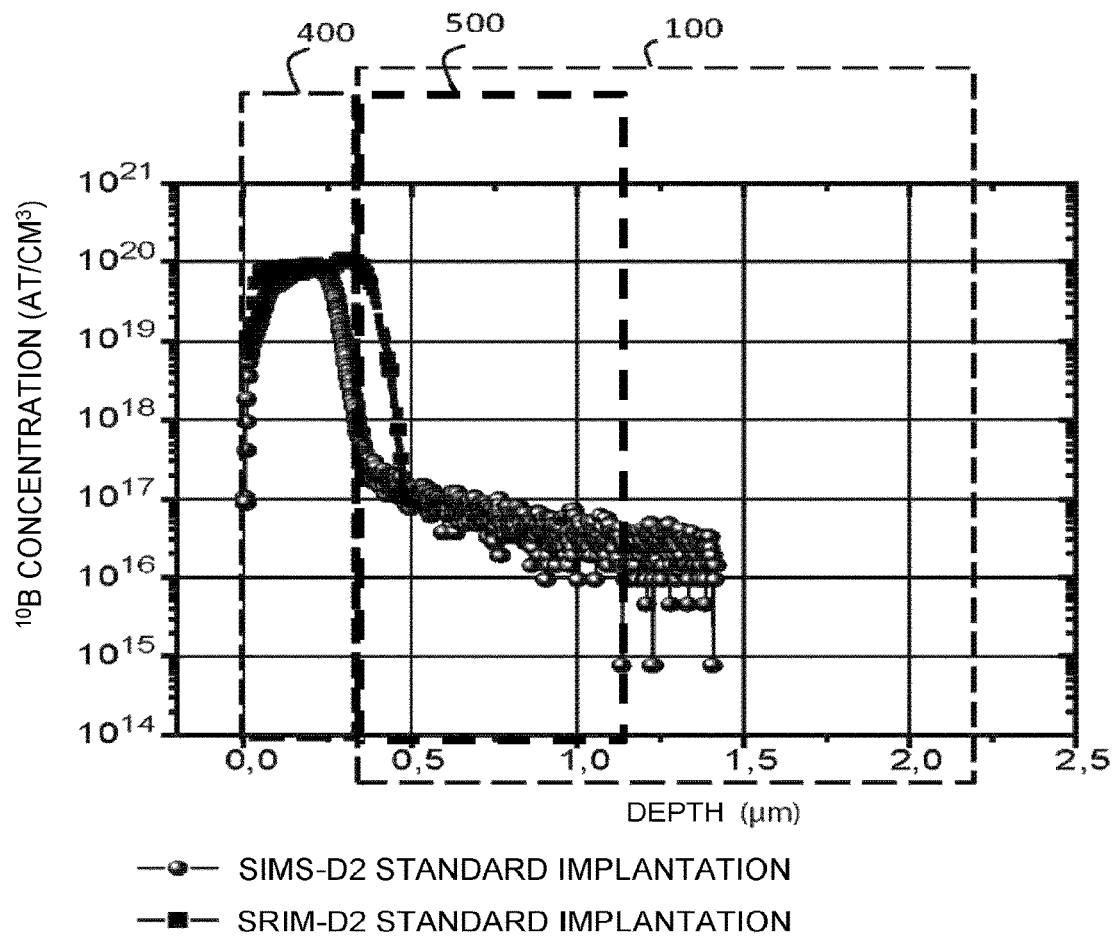
FIG. 4 is a graph showing the superposition of Boron profiles in the epitaxial layer of silicon carbide.

FIG. 4 shows a superposition of Boron profiles of the boron-10 isotope ($^{10}$B) in the upper epitaxial layer 102 formed of silicon carbide. The simulated profile (symbolized by solid squares) after implantation of the dopant material (in this example Boron) and the experimental profile of the SIMS (secondary ion mass spectrometry) type after annealing (symbolized by solid circles), through the second layer 400 and the first layer 100, are compared. The specific characteristics of the oven used during the annealing as well as the associated technological annealing method advantageously results in a very low loss of Boron during the annealing while still substantially limiting a diffusion of Boron in volume. The latter effects are particularly difficult to obtain. It is indeed common to observe after implantation of Boron in the silicon carbide a substantial diffusion (thermal and/or assisted by default) during the annealing, in other words an enlarging of the profile in volume associated with a substantial decrease in the concentration plate.

In this invention, the space charge region 500 advantageously retains the same position before and after annealing, which makes it possible to obtain very good adequacy between the experimental results and the simulation work.

Figure 5:
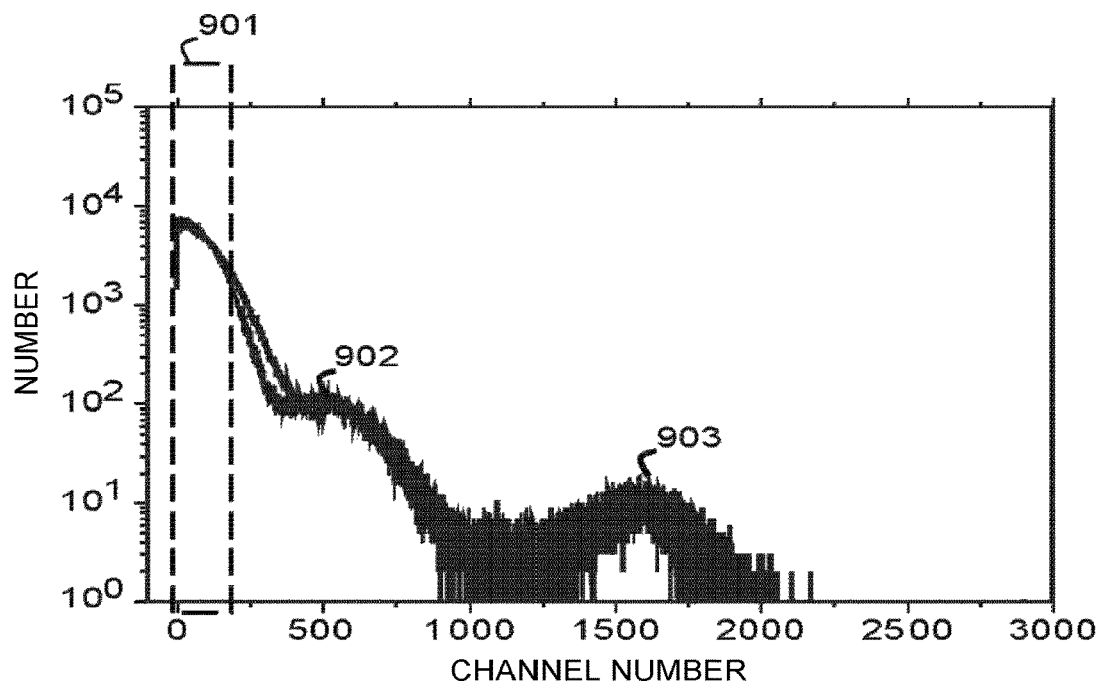
FIG. 5 is a graph showing the variation in the signal according to the polarization voltage.

FIG. 5 shows the variation of the signal according to the polarization voltage. Three peaks 901, 902, 903 are observed. The first peak 901 (channel numbers less than 250) is linked to the detection on gamma rays, which is confirmed by a widening of the peak 901 according to the polarization (widening of the space charge region 500). The third peak 903 (channel≈1500) is directly linked to the detection of incident thermal neutrons. The intensity of this peak 903 is proportional to the flux of thermal neutrons. No variation is detected in the intensity of this peak 903 according to the polarization. Advantageously, this implies being able to work without external polarization, in other words to have a system that from an energy standpoint is autonomous. In this example, the experiences were carried out at a temperature in the neighborhood of 170° C. No notable variation of the signal was observed.

In light of the above, it appears that this invention proposes a simplified method for realization by the formation of the electron conversion layer and the formation of the p-n junction carried out in a single step. The method according to this invention makes it possible to do without the work consisting in optimizing the distance between the electron conversion layer and the space charge region, and this in particular thanks to the identity between the electron conversion layer and the p+ implanted layer. On the other hand, the limits of the use of the detector in a harsh environment are linked only to the physical properties of the silicon carbide (and to the connections), since the detector is entirely based on this material.

Particularly advantageously, the realization of the neutron conversion layer by implantation of Boron more preferably of the isotope 10 type ($^{10}B$) in a substrate preferably comprising silicon carbide makes it possible to limit the constraints (thermal, mechanical, etc.). On the other hand, the silicon carbide advantageously makes it possible to work in an extreme environment, while still retaining a good signal-to-noise ratio.

On the other hand, the simulations (for example of the SRIM type) make it possible to optimize the thickness and the doping of the $p^+$ and n layers, defining as such the position and the thickness of the space charge region so that it is located outside of the peaks of defects provoked by the generation of Lithium and Helium particles, as such increasing the lifespan of the detector and the obtaining of a signal without external polarization (very good discrimination between neutrons and gamma). In addition, controlling the technological parameters (implantation/annealing) makes it possible to obtain the control of parameters for the $p^+$ layer. Advantageously, the introduction of a large quantity of boron-10 isotope ($^{10}B$) by ion implantation, large quantity corresponding for example to the solubility limit in the silicon carbide, even if it can result in a diode of low quality (high "leakage" current), gives rise to a neutron detector (detection of low flux) that is reliable, of very good quality while still remaining inexpensive.

The detection of neutrons has several application scopes. Each application requires different detection systems. Detecting neutrons is, for example, used for experimental and power nuclear reactors, geophysical mining and oil geo-prospection (for example, detection of oil slicks), nuclear methods control in fuel reprocessing plants, the characterization of radioactive waste packages, the follow-up and the control of dismantling operations of nuclear installations, medical physics or the environment.

In light of the preceding description, it appears that the detector according to the invention has many advantages.

The location of the SCR, adjacent to the NCL, as well as outside of the peak of defects, makes it possible to substantially improve the lifespan of the detector, more reliable over time and the signal-to-noise ratio. As such it makes it possible to do without polarization.

Moreover, the method according to the invention for manufacturing detectors makes it highly adaptable and modular according to the application desired. Indeed, the absence of the intermediate layer between SCR and NCL makes it possible to easily vary the thickness of the NCL and that of the SCR, for example in order to adapt to the signals of the application measured, while still being assured that the maximum of ionization is still in the SCR. With detectors of prior art it is difficult to adjust the distance between NCL and SCR.

Moreover, the detector according to the invention through its design, has shown to be particularly robust in a so-called "harsh" environment i.e. that has high temperatures, high pressures and substantial levels of radiation. By way of example, a harsh environment has at least one of the following conditions: a minimum temperature of 150° C., a minimum pressure of 10 bars and/or a minimum irradiation of $10^9$ n·cm$^{-2}$·s$^{-1}$ under 10 Gy·s-1.

On the contrary, the main limit for using existing neutron detectors resides on the one hand in the usage constraints (temperature, pressure, irradiation, etc.), as the devices do not withstand such constraints, and as such have malfunctions of which for example a limited lifespan and on the other hand in the choice to be made concerning the increase in the performance of the detector to the detriment of its lifespan.

In addition, these solutions of prior art necessarily provide for the setting up of an inverse polarization which is required in order to obtain a signal that can be used. This polarization complicates the detector and reduces the discrimination between the neutrons and the gamma particles.

Moreover, by providing for the implantation of the same species in order to form both the NCL and define the p/n junction for the SCR, the detector according to the invention is faster, simpler and less expensive to manufacture.

This invention is not limited to the embodiments described hereinabove but extends to any embodiment in accordance with its goal. Furthermore, although in the precedent example the implanted species that converts the neutrons is Boron, the invention is not limited to this species.

The invention claimed is:

1. A method for realizing a device, having a modeled stack, for detecting a neutron flux having characteristics within predetermined ranges, comprising:
   a phase of determining parameters of the device, the phase comprising:
   simulating penetration of a flux of incident neutrons having characteristics within the predetermined ranges through the modeled stack comprising successively and in order:
   a first electrode;
   a substrate comprising:

a doped first layer comprising at least one first dopant species such that the first layer is an n-doped layer or a p-doped layer, with the first layer being formed by the substrate; and a doped second layer comprising at least one second dopant species such that the second layer is the other among an n-doped layer or a p-doped layer to form, at an interface between the first and second layers, a p-n junction and to form in the first layer and starting from the interface between the first and second layers, a space charge region; with the second layer being formed by implantation of the second dopant species in the substrate; with the second dopant species being taken from neutron-converting materials such that the second layer forms a neutron conversion layer; and a second electrode;

simulating at least one peak of defects created in the first layer of the modeled stack by gaps and/or ionization of the particles generated by collisions between atoms of the second dopant species and neutrons of the flux of incident neutrons having characteristics within the predetermined ranges;

identifying a depth of a peak of closest defects of the interface between the first and second layers of the modeled stack;

determining parameters of the first and second layers of the modeled stack including a depth of the implantation of the second dopant species in the substrate to form the second layer of the modeled stack and contents in the first and second dopant species respectively of the first and second layers of the modeled stack, such that the space charge region extends from the interface between the first and second layers of the modeled stack into the first layer to a depth less than the identified depth of the peak of defects such that the space charge region does not comprise any peak of defects; and manufacturing the device for detecting, wherein the first layer of the modeled stack is formed then the second layer of the modeled stack is formed by implantation of the second dopant species in a portion of the first layer of the modeled stack, the implantation depth and content in second dopant species being determined according to the parameters such that in the device manufactured the space charge region extends from the interface between the first and second layers of the modeled stack into the first layer of the modeled stack to a depth less than the identified depth of the peak of defects.

2. The method according to claim 1, wherein the predetermined characteristics of the flux of neutrons include at least one from among: a given energy and/or a fluence and/or an intensity.

3. The method according to claim 1, wherein the substrate comprises silicon carbide (SiC).

4. The method according to claim 1, wherein during the manufacturing, the depth of the space charge region is adjusted according to the following parameters: content in first dopant species of the first layer; dose of the implantation of the second dopant species, and depth of the implantation of the second dopant species.

5. The method according to claim 1, wherein during manufacturing a position of the space charge region is determined according to following parameters: thickness of the second layer of the modeled stack and/or energy of the implantation of the second dopant species.

6. The method according to claim 1, wherein the second dopant species comprises boron-10 isotope ($^{10}B$).

7. The method according to claim 1, wherein the first layer of the substrate comprises at least one n+ doped lower layer and an n-doped upper layer; with an upper layer comprising a concentration in first dopant species between $10^{14}$ and $10^{16}$ at/cm$^3$.

8. The method according to claim 1, wherein the first electrode is in contact with the first layer of the modeled stack, the first layer of the modeled stack is in contact with the second layer of the modeled stack, and the second electrode is in contact with the second layer of the modeled stack.

9. The method according to claim 1, wherein the peak of defects is a region wherein the concentration in defects is greater than or equal to 0.005 gaps/(Å-ion).

10. The method according to claim 1, wherein the space charge region extends over a distance between 0 and a few tens of microns.

11. The method according to claim 1, comprising adjusting contents in first and second dopant species of the first and second layers of the modeled stack and by adjusting the implantation of the second dopant species, such that the space charge region extends into the first layer of the modeled stack, starting from the interface, to a depth that is sufficient to include a zone where a rate of ionization of the particles generated by collisions between the atoms of the second dopant species and neutrons of the flux of incident neutrons having characteristics within the predetermined ranges is maximum.

12. The method according to claim 1, wherein the first electrode and the second electrode include a metal material.

13. The method according to claim 1, wherein the implantation of the second dopant species is carried out by Boron-10 isotope, with an energy between 20 and 180 keV and a dose between $10^{15}$ and $10^{17}$ cm$^{-2}$.

14. The method according to claim 1, wherein the implantation of the second dopant species is carried out by plasma implantation of Boron-10 isotope, with a voltage between 5 and 15 kV and a dose between $10^{15}$ and $10^{17}$ cm$^{-2}$.

15. The method according to claim 1, wherein the stack of layers is manufactured, and wherein an activation annealing is then carried out under argon, at temperatures between 900° C. and 1700° C., for a duration between 30 and 120 minutes.

16. The method according to claim 7, wherein realization of the n-doped upper layer comprises a chemical vapor deposition.

17. The method according to claim 1, wherein the determining the parameters of the device is at least partially assisted or implemented by computer.

18. The method according to claim 1, wherein the identifying the peak of defects comprises electron microscopy analyses carried out on at least one modeled stack manufactured beforehand and subjected to a flux of neutrons having characteristics within the predetermined ranges.

19. A detector of a flux of neutrons of which the parameters of the flux of neutrons having characteristics within predetermined ranges, with the detector comprising at least one stack of layers comprising successively and in order:

a first electrode;

a substrate comprising:

a doped first layer comprising at least one first dopant species such that the first layer is an n-doped layer or a p-doped layer, with the first layer being formed by the substrate;

a doped second layer comprising at least one second dopant species such that the second layer is the other among an n-doped layer or a p-doped layer to form, at an interface between the first and second layers, a p-n junction and form in the first layer and starting from the interface between the first and second layers, a space charge region;

a second electrode;

wherein:

the second layer is formed by implantation of the second dopant species in the substrate; with the second dopant species being taken from neutron-converting materials such that the second layer forms a neutron conversion layer;

parameters of the first and second layers, and implantation depth of the second dopant species in the substrate to form the second layer and contents in first and second dopant species respectively of the first and second layers, are chosen such that a space charge region extends from the interface between the first and second layers into the first layer to a depth less than a depth of a peak of defects in the first layer by gaps and/or an ionization of particles generated by collisions between atoms of the second dopant species and neutrons when the detector is exposed to a flux of incident neutrons having characteristics within the predetermined ranges.

* * * * *